United States Patent [19]  
Maeda et al.

[11] Patent Number: 4,543,318  
[45] Date of Patent: Sep. 24, 1985

[54] PHOTOPOLYMERIZABLE COMPOSITION CONTAINING HETEROCYCLIC ADDITIVES

[75] Inventors: Minoru Maeda; Masayuki Iwasaki; Fumiaki Shinozaki, all of Shizuoka, Japan

[73] Assignee: Fuji Photo Film Co., Ltd., Kanagawa, Japan

[21] Appl. No.: 626,950

[22] Filed: Jul. 2, 1984

[30] Foreign Application Priority Data

Jul. 1, 1983 [JP] Japan ................ 58-119558
Jul. 1, 1983 [JP] Japan ................ 58-119559

[51] Int. Cl.$^4$ .............................. G03C 1/68
[52] U.S. Cl. ..................... 430/288; 204/159.18; 204/159.22; 204/159.23; 204/159.24; 430/281; 430/919; 430/922; 430/924
[58] Field of Search ........... 430/281, 288, 919, 920, 430/922, 924; 204/159.18, 159.23, 159.24

[56] References Cited

U.S. PATENT DOCUMENTS

| | | | |
|---|---|---|---|
| 3,068,098 | 12/1962 | Williams | 96/29 |
| 3,577,240 | 4/1971 | Nishio et al. | 96/52 |
| 3,650,745 | 3/1972 | Hachmann et al. | 430/281 |
| 4,040,922 | 8/1977 | Wang et al. | 430/920 |
| 4,279,982 | 7/1981 | Iwasaki et al. | 430/288 |

Primary Examiner—Jack P. Brammer  
Attorney, Agent, or Firm—Sughrue, Mion, Zinn, Macpeak & Seas

[57] ABSTRACT

A photopolymerizable composition is described, comprising (1) a non-gaseous ethylenically unsaturated compound which has at least two ethylenically unsaturated terminal groups and is capable of forming a polymer, (2) a thermoplastic polymeric binder, (3) a photopolymerization initiator which is activated by actinic radiation, and (4) at least one of certain heterocyclic compounds. The composition is useful as a photoresist for producing printed circuit boards, printing plates, etc., by etching or plating, and the photoresist has superior adhesion with respect to the base.

14 Claims, No Drawings

PHOTOPOLYMERIZABLE COMPOSITION CONTAINING HETEROCYCLIC ADDITIVES

FIELD OF THE INVENTION

This invention relates to a photopolymerizable composition which polymerizes and cures upon irradiation with actinic radiation and has a improved adhesiveness to metal surfaces, especially copper. More particularly, this invention relates to a photopolymerizable composition which easily cures upon exposure to radiation and forms a photoresist to be treated in an aqueous solution for plating and etching.

BACKGROUND OF THE INVENTION

In the production of printed circuit boards, a dry film photoresist as disclosed in Japanese Patent Publication No. 25231/70 can be laminated on a copper-clad laminate (base) and exposed to actinic light through a mask having, e.g., a wiring pattern, and the unexposed areas are dissolved using an adquate developing solution, thereby obtaining a cured image on the base. The resulting cured image is used as a resist, and the exposed copper which is not covered by the resist is then etched, followed by plating, anodization, etc., to thereby obtain a printed circuit board.

However, the dry film resist has a poor adhesiveness to a metal surface as compared with a solution type photoresist, resulting in various unfavorable phenomenon in the etching or plating. For example, when the base is sprayed with an etching solution or dipped in a plating solution, the solution infiltrates into the interface between the resist and the base, causing the resist to separate from the base. This leads to phenomenon, such as underetching or underplating, which, in turn, causes the edges of the image to become blurred or the resist image to disappear. As a result, the desired pattern is not obtained and many bases are thus wasted.

In the production of printed circuit boards by the use of a dry film resist, the resist pattern is closely attached to the base over the entire surface thereof in some cases. In other cases, the base has through-holes, with both sides of the base and the inside surfaces of the through-holes being coated with a metal layer such as a copper layer, and printed circuits are formed on both sides of the base which are electrically connecting with each other via the inside of the through-holes. In such cases, it is necessary that the resist pattern is not attached to the base over the entire surface thereof, and a resist film is spread on or beneath the holes over the openings of the holes (i.e., tenting) so as to protect the metal layer on the inside of the holes from etching. In such tenting, the resist film thus formed is attached to the base only at a small area around the openings of the base, with the film covering the openings of the holes being supported by its own cohesive force. Therefore, the resist film is required to have sufficient peel-resistance against the etching spray.

In order to improve the peel-resistance, pretreatment of the metal surface was proposed (Japanese Patent Publication No. 5292/79 corresponding to U.S. Pat. No. 3,873,316, and Japanese Patent Application (OPI) Nos. 64919/76 and 64920/76 ("OPI" as used herein means published unexamined application) corresponding to U.S. Pat. No. 4,233,395.

Several other methods for improving the adhesion by adding a variety of compounds to the photosensitive resin layer have also been proposed, as described, for example, in Japanese Patent Publication Nos. 9177/75, 5292/79 and 22481/80, Japanese Patent Application (OPI) Nos. 64919/76, 64920/76, 63087/75, 2724/77, 702/78, 124541/78, 124594/78, 133585/79, 133586/79 and 65947/80, Japanese Patent Publication Nos. 46053/82 and 46054/82, Japanese Patent Application (OPI) No. 11904/81, Japanese Patent Publication No. 21697/82, Japanese Patent Application (OPI) Nos. 75642/81 and 67844/81, Japanese Patent Publication No. 40500/82, Japanese Patent Application (OPI) Nos. 99202/81, 100803/81, 60327/82 and 62047/82.

Since the surface treatment in the former method requires an additional step, it would appear that the latter methods using additives are superior. However, the latter methods are disadvantageous in that the copper surface which is exposed after development turns red, and this discoloration adversely affects subsequent steps such as etching, plating, and soldering; furthermore, some additives discolor print-out dyes, interfere with the photopolymerization reaction, and/or have low miscibility with the photopolymerizable resin composition.

SUMMARY OF THE INVENTION

Accordingly, it is an object of this invention to provide a photopolymerizable composition which is free of the above-described disadvantages and has improved adhesiveness to metal surfaces. More particularly, it is an object of this invention to provide a photopolymerizable composition for forming a dry film resist for the production of printed circuit boards.

It has now been found that adhesion of a photopolymerizable composition to a metal surface can be improved by incorporating therein a heterocyclic compound as hereinafter described.

The object of this invention can be achieved by a photopolymerizable composition which comprises (1) a non-gaseous ethylenically unsaturated compound which has at least two ethylenically unsaturated terminal groups and is capable of forming a polymer, (2) a thermoplastic polymeric binder, (3) a photopolymerization initiator which is activated by actinic radiation, and (4) at least one of heterocyclic compounds represented by the formulae (I) and (II)

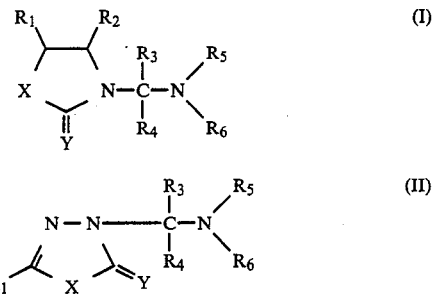

wherein $R_1$ and $R_2$ each represents a hydrogen atom, a substituted or unsubstituted alkyl group, a substituted or unsubstituted aryl group, an aralkyl group, or a substituted or unsubstituted amino group; $R_3$ and $R_4$ each represents a hydrogen atom, an alkyl group or an aryl group; $R_5$ and $R_6$ each represents a hydrogen atom, a substituted or unsubstituted alkyl group, an aryl group, or an aralkyl group, or $R_5$ and $R_6$ may be taken together with the adjacent nitrogen atom to form a pyrrolidine, piperidine, morpholine, or N-substituted piperazine nucleus; X represents an oxygen atom, a sulfur atom, a group

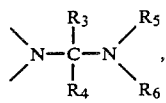

wherein $R_3$, $R_4$, $R_5$ and $R_6$ are as defined above, or a group

wherein $R_7$ represents a hydrogen atom, an alkyl group, or an aryl group; and Y represents an oxygen atom or a sulfur atom.

DETAILED DESCRIPTION OF THE INVENTION

The heterocyclic compound represented by the formula (I) or (II) according to the present invention improves adhesion to metal surfaces without impairing the sensitivity of photopolymerization. Further, the heterocyclic compound of the present invention causes no side effects such as reddening of the copper surface or discoloration of dyes, and has high solubility.

Specific examples of the heterocyclic compounds which can be used in the present invention are shown below, but the present invention is not limited thereto.

Compounds of Formula (I)

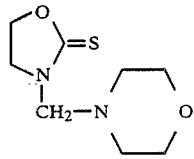
(I)-1

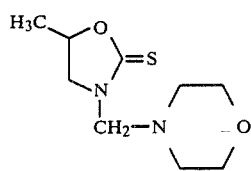
(I)-2

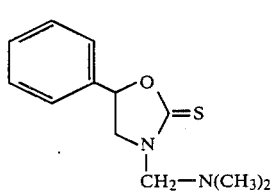
(I)-3

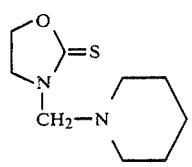
(I)-4

—continued
Compounds of Formula (I)

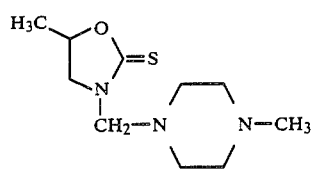
(I)-5

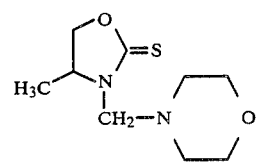
(I)-6

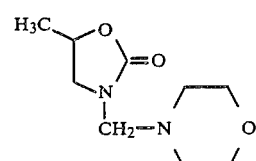
(I)-7

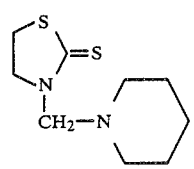
(I)-8

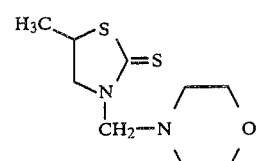
(I)-9

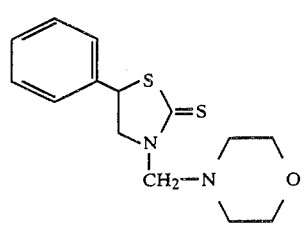
(I)-10

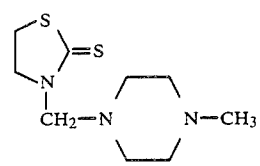
(I)-11

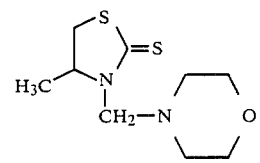
(I)-12

-continued
Compounds of Formula (I)
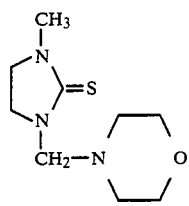
(I)-13
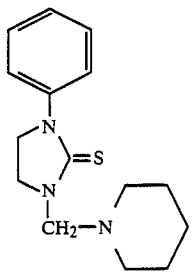
(I)-14
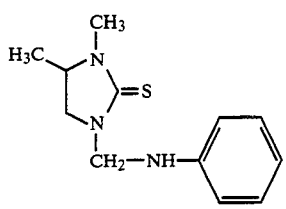
(I)-15
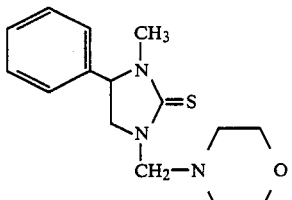
(I)-16
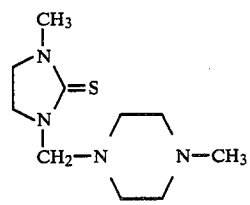
(I)-17
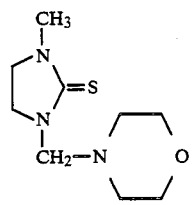
(I)-18
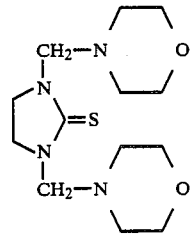
(I)-19
-continued
Compounds of Formula (I)
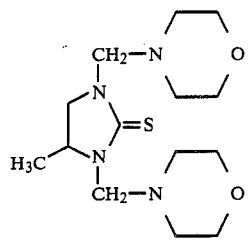
(I)-20
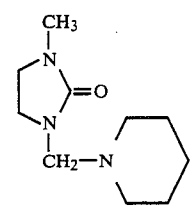
(I)-21
Compounds of Formula (II)
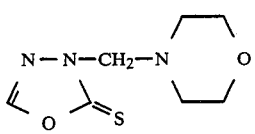
(II)-1
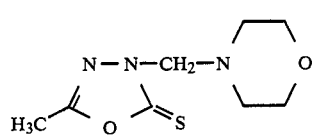
(II)-2
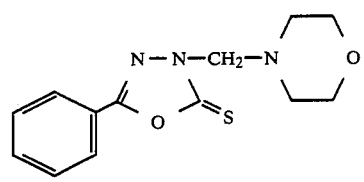
(II)-3
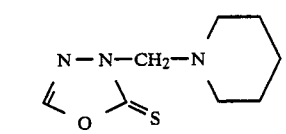
(II)-4
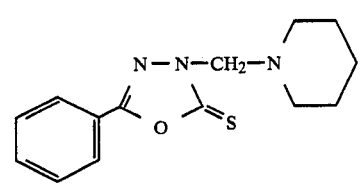
(II)-5
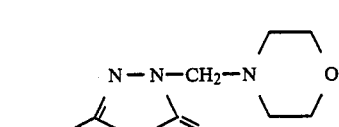
(II)-6

-continued
Compounds of Formula (II)
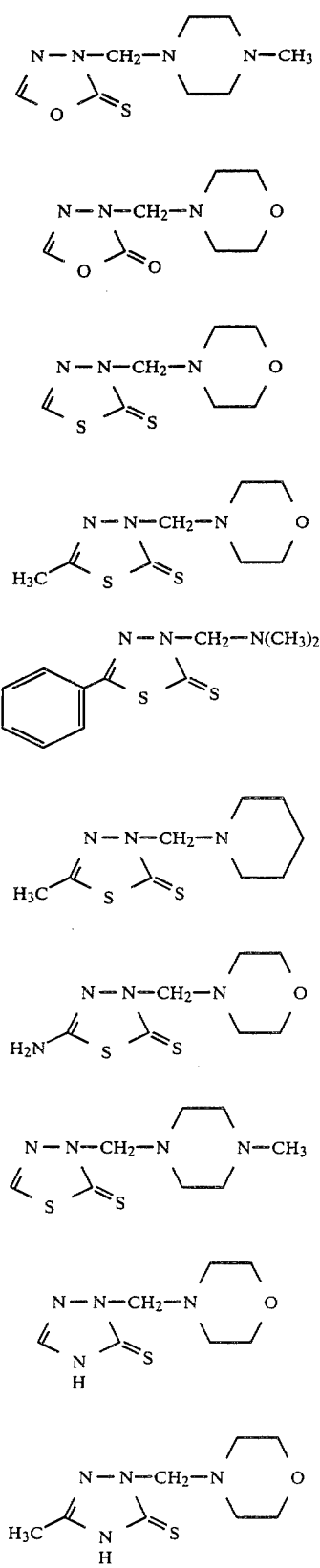
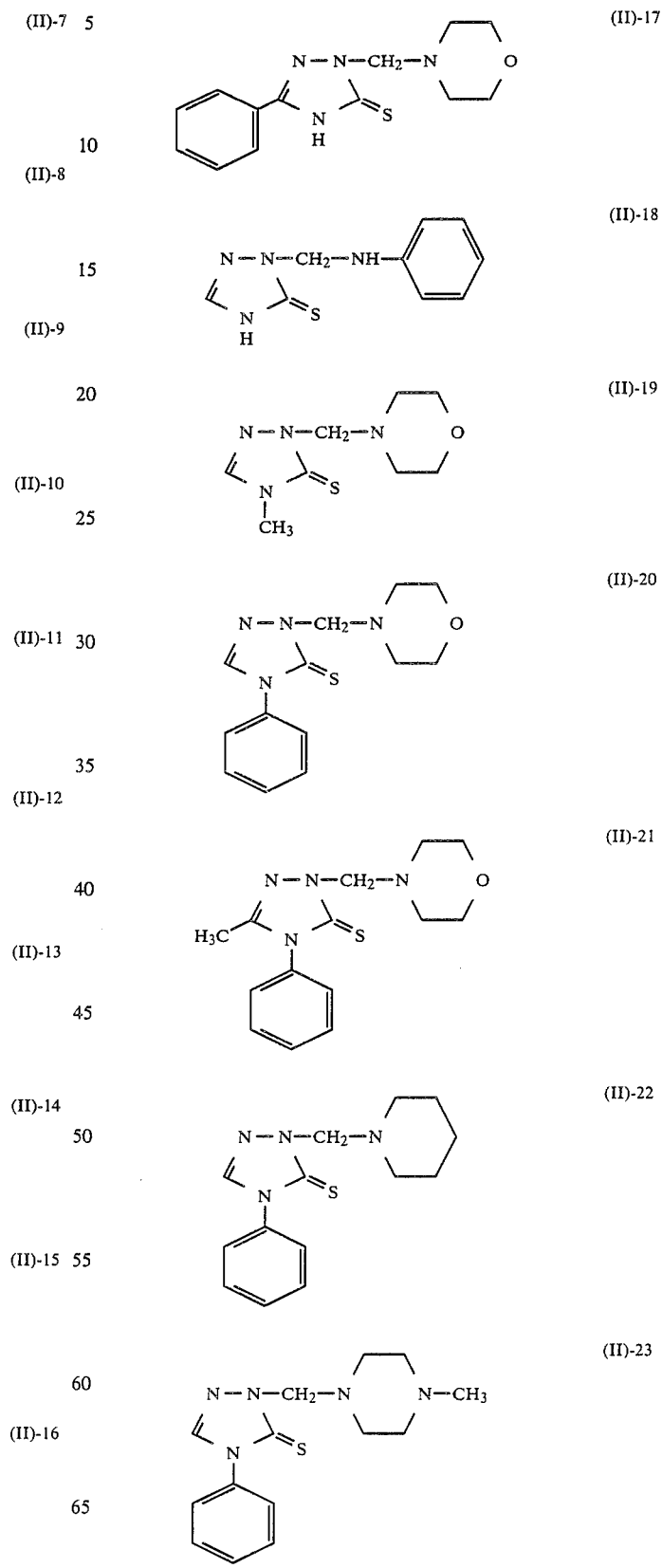

-continued
Compounds of Formula (II)

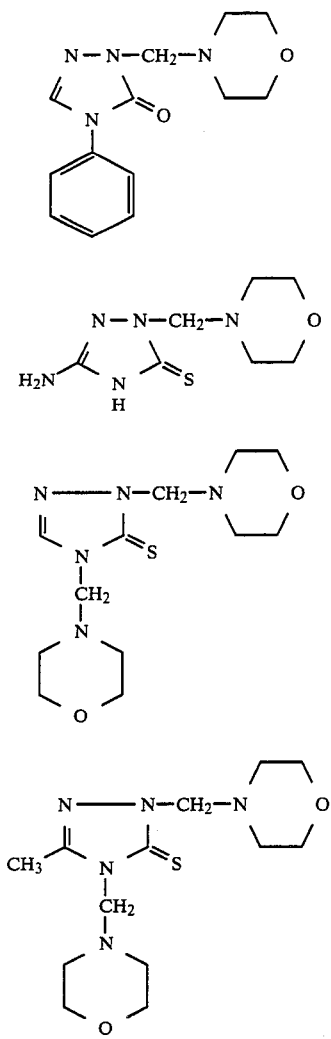

These heterocyclic compounds represented by the formulae (I) and (II) can be used individually or in combinations of two or more thereof. They are used in an amount of from about 0.001 to 10% by weight, and preferably from 0.01 to 5% by weight, based on the total weight of the photopolymerizable composition.

The ethylenically unsaturated compound which can suitably be used in this invention has at least two unsaturated groups at terminals and is capable of photopolymerization upon irradiation with actinic radiation. These compounds are also hereinafter referred to as functional monomers.

Examples of the functional monomers are described in Japanese Patent Publication Nos. 5093/60, 14719/60, and 28727/69 (corresponding to British Pat. No. 1,154,872).

Examples of acrylic esters and methacrylic esters include polyacrylates and polymethacrylates of polyhydric alcohols. The term "poly-" as used herein covers dimers, trimers, tetramers, etc., as well as high molecular weight polymers. The polyhydric alcohols include polyethylene glycol, polypropylene oxide, polybutylene oxide, polycyclohexene oxide, polyethylene oxide, propylene oxide, polystyrene oxide, polyoxetane, polytetrahydrofuran, cyclohexanediol, xylylenediol, di-($\beta$-hydroxyethoxy)benzene, glycerin, diglycerin, neopentyl glycol, trimethylolpropane, triethylolpropane, pentaerythritol, dipentaerythritol, sorbitan, sorbitol, butanediol, butanetriol, 2-butene-1,4-diol, 2-n-butyl-2-ethylpropanediol, 2-butyne-1,4-diol, 3-chloro-1,2-propanediol, 1,4-cyclohexanedimethanol, 3-cyclohexene-1,1-dimethanol, decalindiol, 2,3-dibromo-2-butene-1,4-diol, 2,2-diethyl-1,3-propanediol, 1,5-dihydroxy-1,2,3,4-tetrahydronaphthalene, 2,5-dimethyl-2,5-hexanediol, 2,2-dimethyl-1,3-propanediol, 2,2-diphenyl-1,3-propanediol, dodecanediol, mesoerythritol, 2-ethyl-1,3-hexanediol, 2-ethyl-2-(hydroxymethyl)-1,3-propanediol, 2-ethyl-2-methyl-1,3-propanediol, heptanediol, hexanediol, 3-hexene-2,5-diol, hydroxybenzyl alcohol, hydroxyethyl resorcinol, 2-methyl-1,4-butanediol, 2-methyl-2,4-pentanediol, nonanediol, octanediol, pentanediol, 1-phenyl-1,2-ethanediol, propanediol, 2,2,4,4-tetramethyl-1,3-cyclobutanediol, 2,3,5,6-tetramethyl-p-xylene-$\alpha,\alpha'$-diol, 1,1,4,4-tetraphenyl-1,4-butanediol, 1,1,4,4-tetraphenyl-2-butyne-1,4-diol, 1,2,6-trihydroxyhexane, 1,1'-bi-2-naphthol, dihydroxynaphthalene, 1,1'-methylenedi-2-naphthol, 1,2,4-benzenetriol, bisphenol A, 2,2'-bis(4-hydroxyphenyl)butane, 1,1-bis(4-hydroxyphenyl)cyclohexane, bis(hydroxyphenyl)methane, catechol, 4-chlororesorcinol, 3,4-dihydroxyhydrocinnamic acid, hydroquinone, hydroxybenzyl alcohol, methylhydroquinone, methyl 2,4,6-trihydroxybenzoate, fluoroglucinol, pyrogallol, resorcinol, glucose, $\alpha$-(1-aminoethyl)-p-hydroxybenzyl alcohol, 2-amino-2-ethyl-1,3-propanediol, 2-amino-2-methyl-1,3-propanediol, 3-amino-1,2-propanediol, N-(3-aminopropyl)diethanolamine, N,N'-bis(2-hydroxyethyl)piperazine, 2,2-bis(hydroxymethyl)-2,2',2''-nitrilotriethanol, 2,2-bis(hydroxymethyl)propionic acid, 1,3-bis(hydroxymethyl)urea, 1,2-bis(4-pyridyl)-1,2-ethanediol, N-n-butyldiethanolamine, diethanolamine, N-ethylenediethanolamine, 3-mercapto-1,2-propanediol, 3-piperidino-1,2-propanediol, 2-(2-pyridyl)-1,3-propanediol, triethanolamine, $\alpha$-(1-aminoethyl)-p-hydroxybenzyl alcohol, 3-amino-4-hydroxyphenyl sulfone, etc. Among these acrylic esters and methacrylic esters, the most preferred from the standpoint of availability are ethylene glycol diacrylate, diethylene glycol dimethacrylate, polyethylene glycol diacrylate, trimethylolpropane triacrylate, trimethylolpropane trimethacrylate, pentaerythritol tetraacrylate, pentaerythritol triacrylate, pentaerythritol diacrylate, pentaerythritol dimethacrylate, dipentaerythritol pentacrylate, glycerin triacrylate, diglycerin dimethacrylate, 1,3-propanediol diacrylate, 1,2,4-butanetriol trimethacrylate, 1,4-cyclohexanediol diacrylate, 1,5-pentanediol diacrylate, neopentyl glycol diacrylate, and a triacrylic ester of an ethylene oxide adduct of trimethylolpropane.

The acrylamides and methacrylamides include methylene bisacrylamide and methylene bismethacrylamide, and, in addition, polyacrylamides and polymethacrylamides derived from ethylenediamine, diaminopropane, diaminobutane, pentamethylenediamine, hexamethylene-bis(2-aminopropyl)amine, diethylenetriaminediamine, heptamethylenediamine, octamethylenediamine, polyamines having hetero-atoms between two or more amino groups, and polyamines include a ring structure, e.g., phenylenediamine, xylylenediamine, $\beta$-(4-aminophenyl)ethylamine, diaminobenzoic acid, diaminotoluene, diaminoanthraquinone and diaminofluorene.

The allyl compounds include, for example, diallyl esters of dicarboxylic acids, such as phthalic acid, terephthalic acid, sebacic acid, adipic acid, glutaric acid, malonic acid and oxalic acid. Examples of such allyl esters include diallyl esters and diallyl amides of disulfonic acids, such as anthraquinone disulfonic acid, benzene disulfonic acid, 2,5-dihydroxy-p-benzenedisulfonic acid, dihydroxynaphthalene disulfonic acid and naphthalene disulfonic acid.

The vinyl ether compounds include polyvinyl ethers of the above-described polyhydric alcohols, e.g., ethylene glycol divinyl ether, 1,3,5-tri-β-vinyloxyethoxybenzene, 1,3-di-β-vinyloxyethoxybenzene and glycerol trivinyl ether.

The vinyl esters include divinyl succinate, divinyl adipate, divinyl phthalate, divinyl terephthalate, divinylbenzene-1,3-sulfonate, divinylbutane-1,4-disulfonate, etc.

The styrene compounds include divinylbenzene, p-allylstyrene and p-isopropenestyrene.

Those compounds having two or more different kinds of unsaturated bonds which undergo addition polymerization can be suitably used in this invention. Examples of such compounds include N-β-hydroxyethyl-β-(methacrylamide)ethylacrylate, N,N-bis(β-methacryloxyethyl)acrylamide and allyl methacrylate.

Further, polyfunctional urethane compounds having at least two ethylenically unsaturated groups can also be suitably used in this invention. Such compounds are obtained by reacting a reaction product of a polyol compound having at least two hydroxyl groups and a polyisocyanate compound having at least two isocyanate groups, in a slight excess, with a compound having at least one hydroxyl group and at least one ethylenically unsaturated group.

These polyfunctional monomers can be used alone or in combination of two or more of them. They are generally used in an amount of from about 10 to 500 parts by weight, and preferably from 30 to 200 parts by weight, per 100 parts by weight of the polymeric binder.

The polymeric binder which can be used in the photopolymerizable composition of the present invention is selected from a large variety of synthetic, semisynthetic, and natural high molecular weight substances which meet the following conditions. The compatibility with the polyfunctional monomer, the photopolymerization initiator, and the heterocyclic compound of the present invention should be such that the binder does not separate from the coating solution containing the above-described components in the production processes from the preparation of the solution to the application of the solution and subsequent drying. The binder should have adequate properties according to the method of use of the present invention. For example, when the photopolymerization composition is used for forming a photoresist in tenting, the binder should have appropriate strength, stretchability, abrasion resistance, chemical resistance, etc. Further, the binder should have appropriate molecular weight, intermolecular force, hardness, softening point, crystallinity, elongation at break, and the like, based on the requirements for a particular use. Specific examples of the binder include chlorinated polyolefins, such as chlorinated polyethylene, chlorinated polypropylene, etc.; polyacrylic alkyl esters and polymethacrylic alkyl esters (the alkyl group may be a methyl group, an ethyl group, a butyl group, etc.), such as polymethyl methacrylate, etc.; copolymers of acrylic acid or methacrylic acid with acrylic alkyl ester or methacrylic alkyl ester (the alkyl group is the same as above); polyacrylic acid; polymethacrylic acid; copolymers of acrylic alkyl ester or methacrylic alkyl ester (the alkyl group is the same as above) with at least one monomer, e.g., acrylonitrile, vinyl chloride, vinylidene chloride, styrene, butadiene, etc.; polyvinyl chloride, copolymers of vinyl chloride and acrylonitrile; polyvinylidene chloride; copolymers of vinylidene chloride and acrylonitrile; copolymers of vinyl acetate and vinyl chloride; polyacrylonitrile; copolymers of acrylonitrile and styrene; copolymers of styrene and unsaturated dibasic acid anhydride, e.g., maleic anhydride; polyvinyl butyral; styrene butadiene rubber; chlorinated rubber; cyclized rubber; and acetyl cellulose.

In the case of copolymers, the content of comonomers widely ranges, but preferably is 5 mol% to 95 mol%. Any other polymers than above may also be used as the binder in the present invention as long as these polymers meet the above-described requirements for various properties as binder used in the present invention.

Preferable among the above-enumerated binder polymers are chlorinated polyethylene, chlorinated polypropylene, polymethyl methacrylate, a methacrylic acid-methyl methacrylate polymer containing from 5 to 50 mol% of methacrylic acid, a methyl methacrylate-acrylonitrile copolymer containing from 20 to 80 mol% of methyl methacrylate, a vinyl chloride-acrylonitrile copolymer containing from 20 to 80 mol% of vinyl chloride, a vinylidene chloride-acrylonitrile copolymer containing from 20 to 80 mol% of vinylidene chloride, and a styrene-maleic anhydride copolymer.

These polymers may be used as a binder either individually or as a mixture of two or more thereof in any proportions as long as they are compatible with each other to such an extent that they do not separate in the production processes from the preparation of the coating solution through drying.

The polymeric substances used as binders may have a wide range of molecular weight depending on the kind of the polymer, but is generally from 5,000 to 2,000,000, and preferably from 50,000 to 1,000,000.

The photopolymerization initiator used in the present invention includes known carbonyl compounds, organic sulfur compounds, peroxides, redox compounds, azo and diazo compounds, halogen compounds and photoreducing dyes as described, e.g., in Chapter 5 of *Light-Sensitive Systems* by J. Kosar, 1965 (John Wiley & Sons, Inc.).

Typical examples of the carbonyl compounds are benzoin, benzoin methyl ether, benzophenone, Michler's ketone, 4,4'-bis(diethylamino)benzophenone, anthraquinone, 2-t-butylanthraquinone, diacetyl, 2-benzoylmethylene-3-methyl-β-naphthothiazoline, 5-chloro-3-ethyl-2-p-methoxybenzoyl methylenebenzothiazoline, etc.

Examples of the organic sulfur compounds include di-n-butyldisulfide, dibenzyl disulfide, 2-mercaptobenzothiazole, 2-mercaptobenzimidazole, thiophenol, ethyltrichloromethanesulfonate, etc.

Examples of the peroxides include d-t-butyl peroxide, benzoyl chloride, methyl ethyl ketone peroxide, etc.

The redox compound is composed of a peroxide and a reducing agent and includes one composed of ferrous ions and persulfate ions and one compound of ferric ions and peroxide.

Examples of the azo and diazo compounds are α,α'-azobisisobutyronitrile, 2-azobis-2-methylbutyronitrile and a diazonium salt of p-aminodiphenylamine.

Examples of the halogen compounds include chloromethyl naphthyl chloride, phenacyl chloride, chloroacetone, naphthalene sulfonyl chloride, phenyltribromomethyl sulfone, tris(trichloromethyl)-s-triazine, etc.

Examples of photoreducing dyes are rose bengal, erythrosine, eosine, acriflavine, riboflavin, thionine, etc.

These photopolymerization initiators may be used alone or in combinations of two or more thereof. A combined use of the photopolymerization initiators brings about an enhanced effect, for example, high sensitivity. Specific combinations of initiators can be suitably selected depending upon the desired degree of sensitivity. They are generally used in an amount of from about 0.1 to 20 parts by weight, and preferably from 0.5 to 10 parts by weught, per 100 parts by weight of the polyfunctional monomer.

It is preferable that the photopolymerizable composition according to the present invention further contains a heat polymerization inhibitor. Specific examples of such a heat polymerization inhibitor include, for example, p-methoxyphenol, hydroquinone, alkyl- or aryl-substituted hydroquinones, e.g., methyl-, ethyl-, propyl-, iso-propyl-, t-butyl-, phenyl- and tolyl-substituted hydroquinones, t-butylcatechol, pyrogallol, cuprous chloride, chloranil, naphthylamine, β-naphthol, 2,6-di-t-butyl-p-cresol, pyridine, nitrobenzene, dinitrobenzene, t-toluidine, methylene blue, organic copper and methyl salicylate. These heat polymerization inhibitors are preferably present in an amount of 0.001 to 5 parts by weight per 100 parts by weight of the polyfunctional monomer.

The photopolymerizable composition of this invention may further contain a plasticizer to control the film properties. Typical examples of a plasticizer include phthalic esters, such as dimethyl phthalate, diethyl phthalate, dibutyl phthalate, diisobutyl phthalate, dioctyl phthalate, octylcapryl phthalate, dicyclohexyl phthalate, ditridecyl phthalate, butyl benzyl phthalate, diisodecyl phthalate, diaryl phthalate, etc.; glycol esters, such as dimethyl glycol phthalate, ethylphthalyl ethylglycolate, methyl phthalyl ethylglycolate, butylphthalyl butylglycolate, triethylene glycol dicaprylic ester, etc.; phosphoric esters, such as tricresyl phosphate, triphenyl phosphate, etc.; esters of dibasic fatty acids, such as diisobutyl adipate, dioctyl adipate, dimethyl sebacate, dibutyl sebacate, dioctyl sebacate, dibutyl maleate, etc.; amides, such as benzenesulfonamide, p-toluenesulfonamide, N-n-butylacetamide, etc.; triethyl citrate; glycerin triacetyl ester; and butyl laurate.

The photopolymerizable resin composition in accordance with the present invention is generally used as an image forming material by dissolving or dispersing in a solvent, applying the resulting coating solution to a support by a proper method, followed by drying, and, if desired, covering the dried film with a protective film.

The solvent used for the coating solution includes, for example, ketones, e.g., acetone, methyl ethyl ketone, methyl isobutyl ketone, cyclohexanone, diisobutyl ketone, etc.; esters, e.g., ethyl acetate, butyl acetate, n-amyl acetate, methyl formate, ethyl propionate, dimethyl phthalate, ethyl benzoate, etc.; aromatic hydrocarbons, e.g., toluene, xylene, benzene, ethylbenzene, etc.; halogenated hydrocarbons, e.g., carbon tetrachloride, trichloroethylene, chloroform, 1,1,1-trichloroethane, methylene chloride, monochlorobenzene, etc.; ethers, e.g., tetrahydrofuran, diethyl ether, ethylene glycol monomethyl ether, ethylene glycol monoethyl ether, etc.; dimethylformamide; dimethyl sulfoxide; and the like.

The above-mentioned support should be transparent to light and have a uniform surface. Specifically, the support is comprised of plastic films made of polyethylene terephthalate, polypropylene, polyethylene, cellulose triacetate, cellulose diacetate, polyalkyl acrylates (the alkyl group is a methyl group, an ethyl group, a butyl group, etc., hereinafter the same), polyalkyl methacrylates, alkyl acrylate copolymers, alkyl methacrylate copolymers, polyvinyl chloride, polyvinyl alcohol, polycarbonate, polystyrene, cellophane, polyvinylidene chloride copolymers, polyamide, polyimide, vinyl chloride-vinyl acetate copolymers, polytetrafluoroethylene, polytrifluoroethylene, and the like. Composite materials comprising two or more thereof may also be used.

The support generally has a thickness of from about 5 to 150 μm, and preferably from 10 to 50 μm. Supports having a thickness outside the above broad range may also be used if desired.

The photopolymerizable composition is applied to the support in a dry thickness of from about 5 to 100 μm, and preferably from 10 to 80 μm, depending on the desired performance characteristics of the image.

If desired, the layer of the photopolymerizable composition may be covered with a protective film selected from the above-enumerated plastic films used for the support, paper, polyethylene- or polypropylene-laminated paper and the like. The protective film is generally from 5 to 100 μm thick, and preferably from 10 to 50 μm thick. In forming a protective film, it is required that the adhesive strength between the photopolymerizable composition layer and the support be greater than that between the photopolymerizable composition layer and the protective layer. Examples of the combination of the support and protective film include polyethylene terephthalate/polypropylene, polyethylene terephthalate/polyethylene, polyamide (nylon 6)/polyethylene, polyvinyl chloride/cellophane, polyimide/polypropylene, and the like.

The above-mentioned requirement with respect to the adhesive strength can be achieved by selecting the support and protective film which are different kinds of compounds from each other as mentioned above, or by surface-treating at least either of the support or the protective film. Surface treatment of the support is generally carried out to increase the adhesive strength between the support and the photopolymerizable composition layer, and includes providing an undercoating, corona discharge treatment, flame treatment, UV irradiation, high-frequency irradiation, glow discharge treatment, active plasma treatment and laser irradiation.

To the contrary, the surface treatment of the protective film is usually carried out to lower the adhesive strength between the photopolymerizable composition layer and the protective film, and includes, for example, undercoating with polyorganosiloxane, fluorinated polyolefin or polyfluoroethylene.

After coating, drying is carried out usually at about from 30° to 150° C., and preferably at from 50° to 120° C., for a period of from about 1 to 30 minutes.

When the image forming material is provided with a protective film, the protective film is peeled off so that photopolymerizable layer is exposed, and the image forming material is then laminated under pressure onto a clean base surface.

Various bases can be used according to the particular object for which the present invention is intended. For example, a plastic film which is different from that used for the support in terms of adhesive strength to the photopolymerizable layer, paper, wood, metal plate, glass plate, etc., can be used as a base. In particular, if in using the present invention as a resist to make printed circuits, the base is a plastic plate having a thin layer of a metal, e.g., copper, aluminum, silver, etc., formed on either side thereof or inside surfaces of through-holes made therethrough by lamination or plating, or a thin plastic film having a thin metal layer formed thereon by vacuum evaporation or plating, or if in using the present invention for making a printing plate, the base is an aluminum plate or a plastic film having an aluminum layer formed thereon, in such cases, the aluminum surface is preferably subjected to silicate treatment or anodic oxidation.

Lamination of the photopolymerizable composition layer onto the base is carried out at room temperature (i.e., from about 15° to 30° C.) or under heating at from about 30° to 180° C., and preferably is carried out at a temperature of from 80° to 140° C.

The photosensitive layer and the support thus laminated onto the base is then imagewise exposed through the transparent support to actinic radiation, usually, passing through a mask. Useful light sources include a high-pressure mercury vapor lamp, xenon lamp, carbon arc lamp, halogen lamp or fluorescent lamp, which radiates electromagnetic waves which pass through the transparent support and activate the photopolymerization initiator. The wavelength typically ranges from about 310 to 700 nm, and preferably from 350 to 500 nm, or ultraviolet rays to visible rays. The exposure may also be performed by using laser, electron rays or X-rays.

After imagewise exposure, the unexposed areas are dissolved by an appropriate developing solution, such as an organic solvent, an alkaline aqueous solution, or an alkaline aqueous solution containing an organic solvent thereby to obtain a photo-cured image on the base.

After the image formation, the base can be subjected to additional treatment, if desired. For example, in the production of printed circuit boards, the exposed metal is removed by etching with a known etching solution, such as a copper chloride aqueous solution and a ferric chloride aqueous solution, or the exposed metal is plated with a known plating solution of copper pyrophosphate or copper sulfate, etc.

The photopolymerizable resin composition of the present invention is very suitably used for the production of printed circuit boards. It can also be used for a wide variety of additional purposes, such as the production of lithographic plates, letterpress plates, reliefs, optical duplicates, photography, and the like.

The present invention will now be illustrated in greater detail with reference to the following non-limiting examples. In these examples, all percents are by weight unless otherwise indicated.

EXAMPLE 1

Photopolymerizable compositions of the following formulation were prepared. The identification and quantity of the heterocyclic compound are shown in Table 1. The resulting composition was dissolved in 45 g of methyl ethyl ketone to prepare a coating solution.

| Photopolymerizable Composition Formulation | |
|---|---|
| Polymethyl methacrylate (average molecular weight: 140,000) | 15.0 g |
| Tetraethylene glycol diacrylate | 6.1 g |
| Trimethylolpropane triacrylate | 2.4 g |
| p-Toluenesulfonamide | 1.62 g |
| p-Methoxyphenol | 0.01 g |
| Malachite green | 0.015 g |
| 4,4'-Bis(diethylamino)benzophenone | 0.04 g |
| Benzophenone | 0.15 g |
| Phenyltribromomethylsulfone | 0.37 g |
| Heterocyclic compound | See Table 1 |

Each coating solution was applied to a 25 μm thick polyethylene terephthalate support, followed by drying at 100° C. for 2 minutes to obtain an approximately 50 μm thick coating film. The resulting photosensitive material was laminated onto a cleaned copper-clad laminate board (base) at 120° C. and then exposed for 10 seconds to light radiated from a 2 Kw high-pressure mercury vapor lamp (Jet Light produced by Oak Co., Ltd.) placed 50 cm away. The temporary support was stripped off from the exposed photosensitive material.

The adhesion of the cured film to the base was evaluated by the cross-cut test as follows.

One hundred cross-cuts (1 mm×1 mm) reaching through the cured film to the base were made with a knife per 1 cm². Polyester press-sensitive tape was pressed down over the cross-cut area and then peeled off. The number of 1 mm squares remaining on the base was counted to obtain a remaining percentage. The results obtained are shown in Table 1.

It can be seen from Table 1 that the photopolymerizable composition containing the heterocyclic compound according to the present invention shows higher remaining percentage, indicating its superior adhesion to the base, than the comparative composition containing no heterocyclic compound.

TABLE 1

| Heterocyclic Compound | Amount Added (mg) | Cross-cut Test (%) | Remarks |
|---|---|---|---|
| — | — | 20 | Comparison |
| (I)-1 | 59.2 | 100 | The present invention |
| (I)-2 | 63.3 | 100 | The present invention |
| (I)-4 | 56.9 | 92 | The present invention |
| (I)-6 | 63.3 | 99 | The present invention |
| (I)-8 | 63.3 | 90 | The present invention |
| (I)-9 | 68.0 | 95 | The present invention |
| (I)-12 | 64.5 | 92 | The present invention |
| (I)-13 | 63.0 | 90 | The present invention |
| (I)-19 | 87.9 | 100 | The present invention |
| (I)-20 | 92.0 | 99 | The present invention |
| (II)-1 | 57 | 90 | The present invention |
| (II)-3 | 81 | 100 | The present invention |
| (II)-5 | 80 | 95 | The present invention |
| (II)-9 | 63.5 | 99 | The present invention |

TABLE 1-continued

| Heterocyclic Compound | Amount Added (mg) | Cross-cut Test (%) | Remarks |
|---|---|---|---|
| (II)-10 | 67.5 | 92 | The present invention |
| (II)-13 | 68 | 100 | The present invention |
| (II)-15 | 58.5 | 90 | The present invention |
| (II)-16 | 62.5 | 92 | The present invention |
| (II)-20 | 81 | 100 | The present invention |
| (II)-21 | 85 | 100 | The present invention |
| (II)-22 | 80 | 99 | The present invention |
| (II)-25 | 63 | 95 | The present invention |

EXAMPLE 2

A photosensitive material was prepared in the same manner as described in Example 1. The photosensitive material was laminated at 120° C. onto both sides of a cleaned copper-clad (both sides) laminate board (base) having 500 through-holes 1.5 mm in diameter. A wiring pattern mask was closely contacted with the temporary support, and the photosensitive material was exposed for 10 seconds to light radiated from a 2 Kw high-pressure mercury vapor lamp (Jet Light produced by Oak Co., Ltd.) placed 50 cm away. The wiring pattern mask used had 0.3 to 2.0 mm wide wiring patterns and also has colorless circular patterns of 2.5 mm in diameter in the black background which correspond to the openings of the through-holes of the base. When the photosensitive material was exposed with the mask in close contact with the temporary support in such a manner that each of the circular patterns covers the individual openings of the through-holes, a resist pattern which covers all of the 500 openings of the through-holes can be formed (tenting). After the temporary support was stripped off from the exposed photosensitive material, the unexposed areas were dissolved by spraying 1,1,1-trichloroethane from a nozzle for 60 seconds, followed by washing and drying, to thereby obtain a positive image of wiring patterns.

The copper base having resist patterns thereon was subjected to spary etching with 42° Bé ferric chloride aqueous solution at 40° C. The resist film formed on the copper layer other than the areas covering the openings of the through-holes did not peel at all during the etching in all cases in which the heterocyclic compound of the present invention had been incorporated. The ratio of resist film formed (tented) on the openings of the through-holes (referred to as the tenting ratio) is shown in Table 2. The heterocyclic compound and its amount added are also shown in Table 2.

As shown in Table 2, it was revealed that the photosensitive material containing the heterocyclic compound of the present invention forms a resist film on the openings of the through-holes at a very high tenting ratio as compared with the comparative material containing no heterocyclic compound.

TABLE 2

| Heterocyclic Compound | Amount Added (mg) | Tenting Ratio (%) | Remarks |
|---|---|---|---|
| — | — | 30 | Comparison |
| (I)-1 | 59.2 | 100 | The present invention |
| (I)-2 | 63.3 | 100 | The present invention |
| (I)-4 | 59.6 | 97 | The present invention |
| (I)-6 | 63.3 | 100 | The present invention |
| (I)-8 | 63.3 | 95 | The present invention |
| (I)-9 | 68.0 | 98 | The present invention |
| (I)-12 | 64.5 | 97 | The present invention |
| (I)-13 | 63.0 | 95 | The present invention |
| (I)-19 | 87.9 | 100 | The present invention |
| (I)-20 | 92.0 | 100 | The present invention |
| (II)-1 | 57 | 96 | The present invention |
| (II)-3 | 81 | 100 | The present invention |
| (II)-5 | 80 | 98 | The present invention |
| (II)-9 | 63.5 | 100 | The present invention |
| (II)-10 | 67.5 | 97 | The present invention |
| (II)-13 | 68 | 100 | The present invention |
| (II)-15 | 58.5 | 96 | The present invention |
| (II)-16 | 62.5 | 97 | The present invention |
| (II)-20 | 81 | 100 | The present invention |
| (II)-21 | 85 | 100 | The present invention |
| (II)-22 | 80 | 100 | The present invention |
| (II)-25 | 63 | 98 | The present invention |

EXAMPLE 3

A sensitive material was preprared in the same manner as in Example 1 except that 4,4'-bis(diethylamino)-benzophenone, benzophenone and phenyltribromomethylsulfone were replaced by 0.19 g of 3-chlorobenzanthrone and 0.19 g of Michler's ketone. The resulting sensitive material was laminated onto a cleaned copper-clad laminate board at 120° C. and exposed in the same manner as in Example 1. After the exposure, the temporary support was peeled away. An epoxy adhesive was applied to the cured resist surface, and a copper base was laminated thereon. The shear peel strength of the laminated resist layer and the copper base was measured. The results obtained are shown in Table 3 together with the heterocyclic compound and the amount added.

It is noted from Table 3 that the sensitive material containing the heterocyclic compound of the present invention has a high shear strength as compared with the comparative material containing no heterocyclic compound.

TABLE 3

| Heterocyclic Compound | Amount Added (mg) | Shear Peel Strength (Kg/cm$^2$) | Remarks |
|---|---|---|---|
| — | — | 10.5 | Comparison |
| (I)-1 | 59.2 | 36.5 | The present |

TABLE 3-continued

| Heterocyclic Compound | Amount Added (mg) | Shear Peel Strength (Kg/cm²) | Remarks |
|---|---|---|---|
| (I)-2 | 63.3 | 37.0 | The present invention |
| (I)-6 | 63.3 | 33.0 | The present invention |
| (I)-9 | 68.0 | 35.0 | The present invention |
| (I)-19 | 87.9 | 38.0 | The present invention |
| (II)-3 | 81 | 35.0 | The present invention |
| (II)-5 | 80 | 33.5 | The present invention |
| (II)-13 | 68 | 37.0 | The present invention |
| (II)-16 | 62.5 | 36.5 | The present invention |
| (II)-20 | 81 | 38.0 | The present invention |
| (II)-21 | 85 | 38.0 | The present invention |

EXAMPLE 4

Sensitive materials were prepared in the same manner as in Example 1 using the following heterocyclic compounds:

| | |
|---|---|
| Compound (I)-1 | 59.2 mg |
| Compound (I)-9 | 68.0 mg |
| Compound (I)-19 | 87.9 mg |
| Compound (II)-3 | 81 mg |
| Compound (II)-13 | 68 mg |
| Compound (II)-20 | 81 mg |
| Compound (II)-21 | 85 mg |

Each of the resulting sensitive materials was laminated onto a copper-clad board. Exposure, development and washing was performed in the same manner as in Example 1, thereby obtaining a copper-clad base having a cured resist pattern thereon. The exposed copper was plated with solder by using a borofluoride bath of the following composition:

| | |
|---|---|
| Tin borofluoride Sn(BF₄)₂ (45% aq. solution) | 300 g |
| Lead borofluoride Pb(BF₄)₂ (45% aq. solution) | 100 g |
| Borofluoric acid HBF₄ (42% aq. solution) | 200 g |
| Boric acid H₃BO₃ | 28 g |
| Water | q.s. to 1 |

The plating was conducted using a solder rod (tin/-lead=6:4) as an anode at a bath temperature of 30° C. for 30 minutes at a current density of cathode of 3.0 A/dm². The plating could be performed very satisfactorily without peeling of the resist pattern of occurrence of pinholes. The resist was easily removed by spraying methylene chloride from a nozzle. Further, the exposed copper was etched by a 20% aqueous solution of ammonium persulfate. Thus, there was obtained a clear wiring pattern.

While the invention has been described in detail and with reference to specific embodiments thereof, it will be apparent to one skilled in the art that various changed and modifications can be made therein without departing from the spirit and scope thereof.

What is claimed is:

1. A photopolymerizable composition comprising (1) a thermoplastic polymeric binder, (2) 10 to 500 parts by weight per 100 parts of the thermoplastic polymer binder of a non-gaseous ethylenically unsaturated compound which has at least two ethylenically unsaturated terminal groups and is capable of forming a polymer, (3) 0.1 to 20 parts by weight per 100 parts by weight of the non-gaseous ethylenically unsaturated compound of a photopolymerization initiator which is activated by actinic radiation, and (4) 0.001 to 10% by weight based on the total weight of the photopolymerizable composition of at least one heterocyclic compound represented by the Formulae (I) and (II)

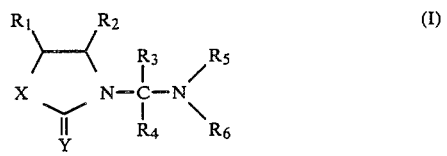

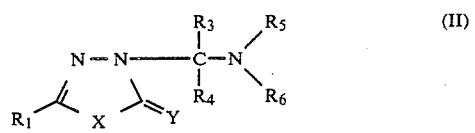

wherein $R_1$ and $R_2$ each represents a hydrogen atom, a substituted or unsubstituted alkyl group, a substituted or unsubstituted aryl group, an aralkyl group, or a substituted or unsubstituted amino group; $R_3$ and $R_4$ each represents a hydrogen atom, an alkyl group, or an aryl group; $R_5$ and $R_6$ each represents a hydrogen atom, a substituted or unsubstituted alkyl group, an aryl group, or an aralkyl group, or $R_5$ and $R_6$ may be taken together with the adjacent nitrogen atom to form a pyrrolidone, piperidine, morpholine, or N-substituted piperazine ring; X represents an oxygen atom, a sulfur atom, a group

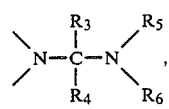

wherein $R_3$, $R_4$, $R_5$ and $R_6$ are as defined above, or a group $=N-R_7$, wherein $R_7$ represents a hydrogen atom, an alkyl group, or an aryl group; and Y represents an oxygen atom or a sulfur atom.

2. A photopolymerizable composition as in claim 1, wherein a heat polymerization inhibitor is included in the photopolymerizable composition in an amount of from 0.001 to 5 parts by weight per 100 parts by weight of the non-gaseous ethylenically unsaturated compound.

3. A photopolymerizable composition as in claim 1, wherein said heterocyclic compound or compounds is or are present in a total amount of from 0.01 to 5% by weight based on the total weight of the photopolymerizable composition.

4. A photopolymerizable composition as in claim 1, wherein said photopolymerizable composition contains 1 or more heterocyclic compounds represented by Formula (I).

5. A photopolymerizable composition as in claim 1, wherein said photopolymerizable composition contains 1 or more heterocyclic compounds represented by Formula (II).

6. A photopolymerizable composition as in claim 1, wherein said non-gaseous ethylenically unsaturated compound is present in an amount of 10 to 500 parts by weight per 100 parts of the thermoplastic binder.

7. A photopolymerizable composition as claimed in claim 1, wherein said binder is selected from the group consisting of chlorinated polyolefins; polyacrylic alkyl esters; polymethyacrylic alkyl esters; copolymers of acrylic acid or methacrylic acid with an acrylic alkyl ester or methacrylic alkyl ester; polyacrylic acid; polymethacrylic acid; copolymers of an acrylic alkyl ester or methacrylic alkyl ester with at least one monomer selected from the group including acrylonitrile, vinyl chloride, vinylidene chloride, styrene and butadiene; polyvinyl chloride, copolymers of vinyl chloride and acrylonitrile; polyvinylidene chloride; copolymers of vinylidene chloride and acrylonitrile; copolymers of vinyl acetate and vinyl chloride; polyacrylonitrile; copolymers of acrylonitrile and styrene; copolymers of styrene and an unsaturated dibasic acid anhydride; polyvinyl butyral; styrene butadiene rubbers; chlorinated rubbers; cyclized rubbers; and acetyl cellulose.

8. A photopolymerizable composition as in claim 7, wherein the content of comonomers in said copolymers is in the range of 5 mol% to 95 mol%.

9. A photopolymerizable composition as claimed in claim 1, wherein said binder is selected from the group consisting of chlorinated polyethylene, chlorinated polypropylene, polymethyl methacrylate, a methacrylic acid-methyl methacrylate copolymer containing from 5 to 50 mol% of methacrylic acid, a methyl methacrylate-acrylonitrile copolymer containing from 20 to 80 mol% of methyl methacrylate, a vinyl chloride-acrylonitrile copolymer containing from 20 to 80 mol% of vinyl chloride, a vinylidene chloride-acrylonitrile copolymer containing from 20 to 80 mol% of vinylidene chloride and a styrene-maleic anhydride copolymer.

10. A photopolymerizable composition as claimed in claim 1, were said thermoplastic binder comprises polymeric substances with a molecular weight in the range of 5,000 to 2,000,000.

11. A photopolymerizable composition as claimed in claim 10, wherein said molecular weight is in the range of from 50,000 to 1,000,000.

12. A photopolymerizable composition as claimed in claim 1, wherein said photopolymerization initiator is selected from the group consisting of carbonyl compounds, organic sulfur compounds, peroxides, redox compounds, azo and diazo compounds, halogen compounds and photoreducing dyes.

13. A photopolymerizable composition as in claim 1, wherein said photopolymerization initiator is contained in the range of from 0.5 to 10 parts by weight per 100 parts by weight of said non-gaseous ethylenically unsaturated compound.

14. A photopolymerizable composition as claimed in claim 2, wherein said polymerization inhibitor is selected from the group consisting of p-methoxyphenol, hydroquinone, alkyl- or aryl-substituted hydroquinones, t-butylcatechol, pyrogallol, cuprous chloride, chloranil, naphthylamine, b-naphthol, 2,6-di-t-butyl-p-cresol, pyridine, nitrobenzene, dinitrobenzene, t-toluidine, methylene blue, organic copper and methyl salicylate.

* * * * *